United States Patent [19]

Sugawara

[11] 4,455,535
[45] Jun. 19, 1984

[54] FREQUENCY CHARACTERISTIC ADJUSTING APPARATUS

[75] Inventor: Tsutomu Sugawara, Yokosuka, Japan

[73] Assignee: Tokyo Shibaura Denki Kabushiki Kaisha, Kanagawa, Japan

[21] Appl. No.: 301,436

[22] Filed: Sep. 11, 1981

[30] Foreign Application Priority Data

Sep. 29, 1980 [JP] Japan .................... 55-135513

[51] Int. Cl.³ .................... H03F 3/68; H03G 3/30
[52] U.S. Cl. .................... 330/126; 330/278; 330/84
[58] Field of Search .......... 330/84, 126, 234, 257, 330/278, 279

[56] References Cited

U.S. PATENT DOCUMENTS 3,667,043 5/1972 Ahlgren .................... 330/126
3,893,038 7/1975 Omata et al. .................... 330/84

Primary Examiner—James B. Mullins
Assistant Examiner—G. Wan
Attorney, Agent, or Firm—Cushman, Darby & Cushman

[57] ABSTRACT

Frequency characteristic adjusting apparatus used in sound apparatus or the like, in which an input signal is divided into first and second frequency bands after being amplified, the gain of the signal of the first frequency band controlled by first and second gain control circuits respectively, the gain of the signal of the second frequency band controlled by third and fourth gain control circuits respectively, and the output signals from the first and second gain control circuits added and negatively fed back to the amplifier. The output signals from the third and fourth gain control circuits are also added.

9 Claims, 12 Drawing Figures

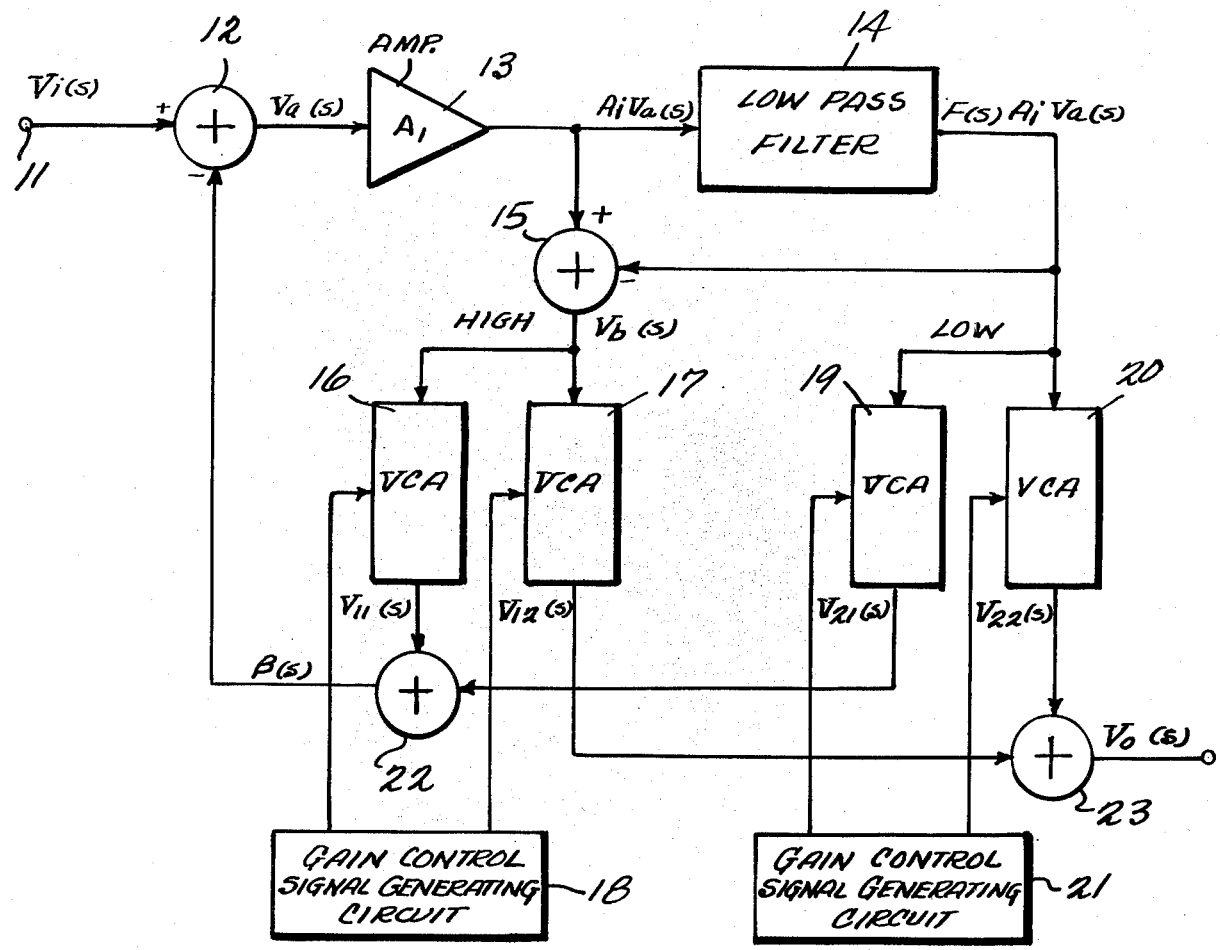
F I G. 2

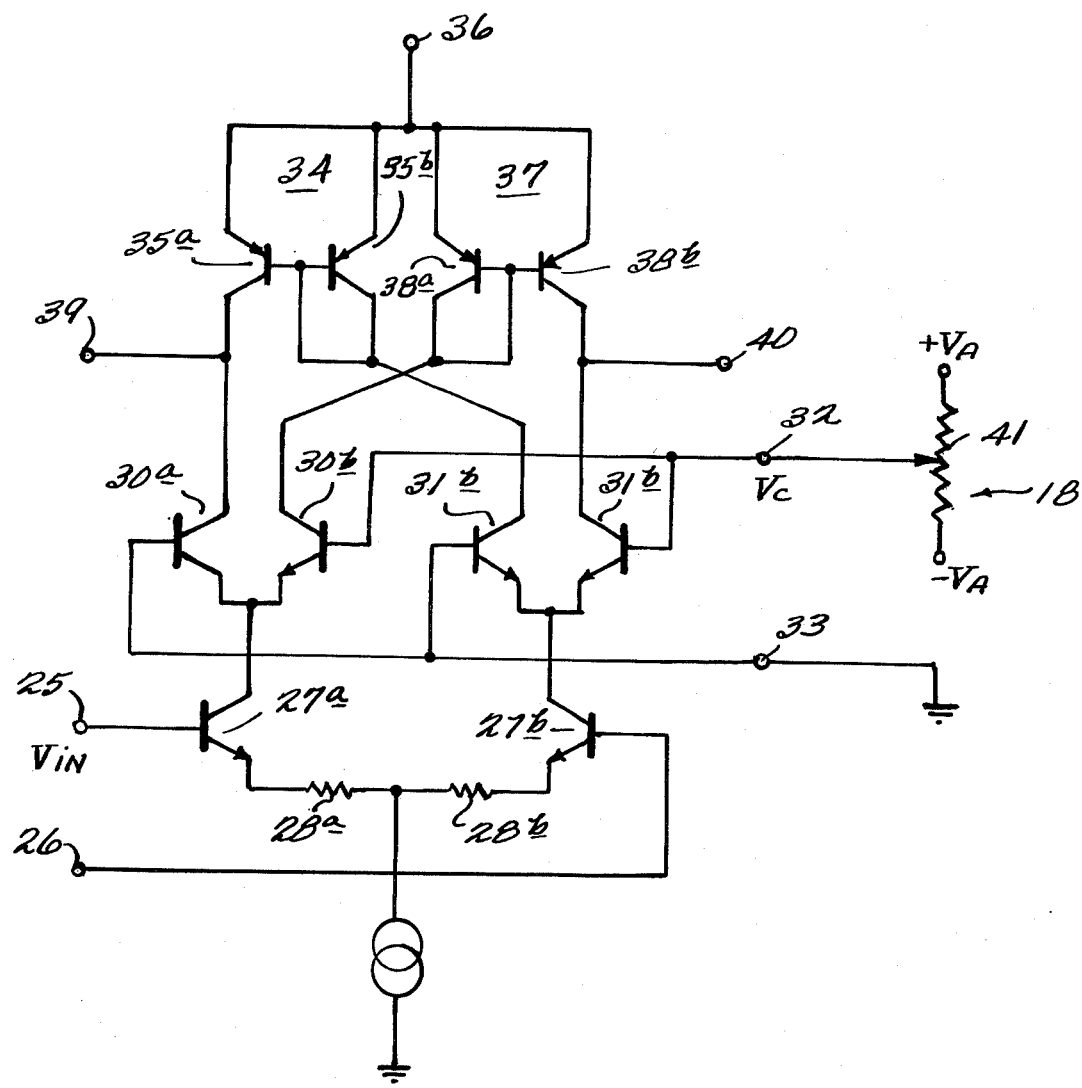
F I G. 3

FREQUENCY CHARACTERISTIC ADJUSTING APPARATUS

BACKGROUND OF THE INVENTION

This invention relates to apparatus for adjusting a frequency characteristic of an electric signal such as an audio signal.

A frequency characteristic adjusting apparatus, which divides an electric signal into a plurality of frequency band signals, and then selectively increases or decreases the amplitude of the band divided signals, is used, for example, as a tone controlling circuit in an audio apparatus.

A prior art frequency characteristic adjusting apparatus, as described in U.S. Pat. No. 2,760,011, includes a band dividing filter, for example, a low-pass filter for filtering the low frequency signal component in an input signal. This prior art apparatus includes a subtraction circuit for subtracting the output signal of the low-pass filter from the input signal thereof so as to obtain the high frequency signal component in the input signal. The thus obtained low and high frequency signal components are amplified respectively, and an adder circuit adds the output signals from the amplifiers. The frequency characteristic of the input signal may be adjusted by increasing or decreasing the gain of the amplifiers. However, such frequency characteristic adjusting apparatus has a following problem. In this apparatus, as shown in FIG. 1, the frequency characteristic of the total gain TG1 is adjusted with amplitude of the low frequency signal component GL1 larger than that of the high frequency signal component G4. On the other hand, the frequency characteristic of the total gain TG2 has the amplitude of the low frequency signal component GS1 and is smaller than that of the high frequency signal component G4. As apparent from these characteristics, the characteristic curve TG1 has a pattern asymmetric to the pattern of the characteristic curve TG2 with respect to the flat frequency characteristic of the total gain obtained while the amplitude of the low frequency signal component is equal to that of the high frequency signal component. Under such condition, the frequency characteristic adjusting apparatus is not a satisfactory tone-controlling circuit.

One method for overcoming this drawback is by varying the cut-off frequency of the filter in response to variation of the amplitude of the low or high frequency signal component. However, the structure of such a circuit is very complex and it is difficult to obtain the correct symmetric frequency characteristic.

SUMMARY OF THE INVENTION

It is an object of the present invention to provide a frequency characteristic adjusting apparatus which can obtain the symmetric frequency characteristic without varying the cut-off frequency of the filter.

It is another object of the present invention to provide a frequency characteristic adjusting apparatus having a simple structure and capable of obtaining the correctly symmetric frequency characteristic.

In accordance with a preferred embodiment of this invention, an input signal is amplified sufficiently by an amplifier. The amplified signal is separate into at least a first and a second frequency band. The signal of the first frequency band is controlled by the gain by first and second gain control circuits respectively. The signal of the second frequency band is controlled the gain by the third and fourth gain control circuits respectively. The output signals from the first and third gain control circuits are added and then negatively fed back to the amplifier. The output signals from the second and fourth gain control circuits are added and then transmitted to an output terminal. The frequency characteristic is adjusted by varying the gains of at least either the first and second gain control circuits or the third and fourth gain control circuits in response to gain control signal from a gain control signal generating circuit.

BRIEF DESCRIPTION OF THE DRAWINGS

These and other objects and advantages of the invention will become more apparent and more readily appreciated from the following detailed description of the presently preferred exemplary embodiments of the invention taken in conjunction with the accompanying drawings, in which:

FIG. 2 is a schematic block diagram showing the first embodiment of the frequency characteristic adjusting apparatus according to the present invention;

FIG. 3 shows an embodiment of the voltage controlled amplifier and the control signal generating circuit used in the frequency characteristic adjusting apparatus of FIG. 2;

DESCRIPTION OF THE PREFERRED EMBODIMENTS

Figure 1:
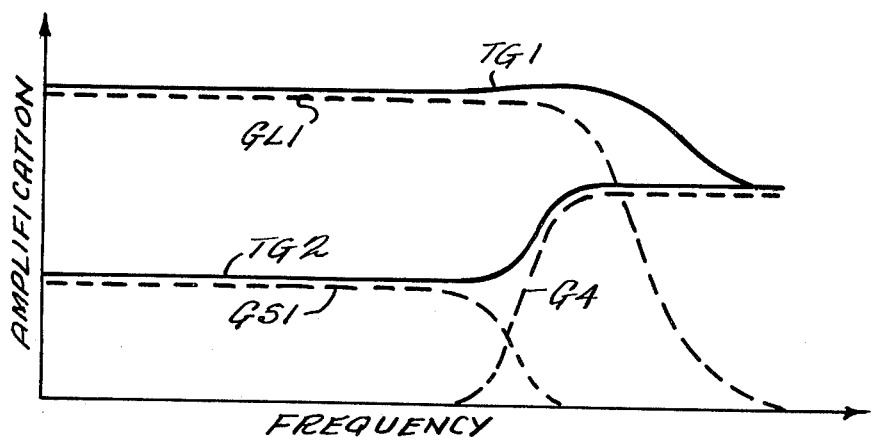
FIG. 1 shows the frequency characteristic of the prior art frequency characteristic adjusting apparatus.

Referring to FIG. 2 showing one embodiment of the frequency characteristic adjusting apparatus, an input signal Vi(s) is applied to an input terminal 11 and delivered to a subtraction circuit 12. Subtraction circuit 12 subtracts a feedback signal B(s), which will be described later, from the input signal Vi(s). An output signal of subtraction circuit 12 is delivered to an amplifier 13 having a gain $A_1$ and amplified by it. An amplified signal is delivered to a filter circuit having a signal transmission characteristic F(s) such as a low-pass filter 14. The input and output signals of low-pass filter 14 are delivered to a subtraction circuit 15. Subtraction circuit 15 subtracts the output signal of low-pass filter 14 from the input signal thereof.

The output of subtraction circuit 15 is delivered to first and second gain control circuits such as voltage controlled amplifiers (hereinafter VCAs) 16 and 17, respectively. A gain control signal generating circuit 18 is connected to control terminals of VCAs 16 and 17 so as to supply a gain control signal to VCAs 16 and 17.

The output of low-pass filter 14 is delivered to third and fourth gain control circuits such as VCAs 19 and 20, respectively. A gain control signal generating circuit 21 is connected to the control terminal of VCAs 19 and 20 so as to supply a gain control signal to VCAs 19 and 20. The outputs of VCAs 16 and 19 are supplied to an adder circuit 22. Adder circuit 22 adds the outputs from VCAs 16 and 19 to each other and delivers its output signal B(s) to subtraction circuit 12. The outputs of VCAs 17 and 20 are supplied to an adder circuit 23. Adder circuit 23 adds the outputs from VCAs 17 and 20 to each other and delivers its output signal VO(s) to an output terminal 24.

In operation, if the input signal of amplifier 13 is denoted by Va(s), the output signal of amplifier 13 is expressed by $A_1 Va(s)$. The output signal $A_1Va(s)$ of amplifier 13 is delivered to filter circuit 14 having the transmission characteristic F(s). Accordingly, the output signal of filter circuit 14 is expressed by $F(s)A_1Va(s)$. Subtraction circuit 15 subtracts the output signal $F(s)A_1Va(s)$ of filter circuit 14 from the input signal $A_1Va(s)$ thereof. Accordingly, the output signal $V_b(s)$ of subtraction circuit 15 is expressed by the following equation:

$$V_b(s) = [1 - F(s)]A_1 Va(s) \qquad (1)$$

The output signal of subtraction circuit 15 is amplified by VCA 16 having the gain $G_{11}$ and VCA 17 having the gain $G_{12}$ respectively. As a result, the output signals $V_{11}(s)$ and $V_{12}(s)$ of VCAs 16 and 17 are expressed by the following equations:

$$V_{11}(s) = G_{11}[1 - F(s)]A_1 Va(s) \qquad (2)$$

$$V_{12}(s) = G_{12}[1 - F(s)]A_1 Va(s) \qquad (3)$$

The output signal $F(s)A_1Va(s)$ of filter circuit 14 is delivered to VCA 19 having the gain $G_{21}$ and VCA 20 having the gain $G_{22}$ respectively, and amplified by them. As a result, the output signals $V_{21}(s)$ and $V_{22}(s)$ of VCAs 19 and 20 are expressed by the following equations:

$$V_{21}(s) = G_{21}F(s)A_1 Va(s) \qquad (4)$$

$$V_{22}(s) = G_{22}F(s)A_1 Va(s) \qquad (5)$$

The output signals $V_{11}(s)$ and $V_{21}(s)$ of VCAs 16 and 19 are delivered to adder circuit 22 and added to each other. Accordingly, the output signal B(s) of adder circuit 22 is expressed by the following equation:

$$B(s) = G_{11}[1 - F(s)]A_1 Va(s) + G_{21}F(s)A_1 Va(s) \qquad (6)$$

This output signal B(s) of adder circuit 22 is delivered to subtraction circuit 12.

The output signals $V_{12}(s)$ and $V_{22}(s)$ of VCAs 17 and 20 are delivered to adder circuit 23 and added to each other. As a result, the output signal Vo(s) of adder circuit 23 is expressed by the following equation:

$$Vo(s) = G_{12}[1 - F(s)]A_1 Va(s) + G_{22}F(s)A_1 Va(s) \qquad (7)$$

The output signal Vo(s) of adder circuit 23 is delivered to output terminal 24.

Meanwhile the signal Va(s) from subtraction circuit 12 is obtained by subtracting the negative feedback signal B(s) from the input signal Vi(s). Accordingly, from the equation (6) Va(s) is expressed by the following equation:

$$Va(s) = Vi(s) - G_{11}[1 - F(s)]A_1 Va(s) - G_{21}F(s)A_1 Va(s) \qquad (8)$$

Accordingly, from the equations (7) and (8), the input signal Vi(s) and the output signal Vo(s) has the relationship expressed by the following equation:

$$Vo(s) = \frac{G_{12}[1 - F(s)] + G_{22}F(s)}{\frac{1}{A_1} + G_{11}[1 - F(s)] + G_{21}F(s)} \cdot Vi(s) \qquad (9)$$

The transmission characteristic H(s) is expressed by the following equation:

$$H(s) = \frac{G_{12}[1 - F(s)] + G_{22}F(s)}{\frac{1}{A_1} + G_{11}[1 - F(s)] + G_{21}F(s)} \qquad (10)$$

If the gain A1 of amplifier 13 is sufficiently large, $1/A_1$ is near to zero, and the equation (10) is expressed by the following equation:

$$H(s) = \frac{G_{12}[1 - F(s)] + G_{22}F(s)}{G_{11}[1 - F(s)] + G_{21}F(s)} \qquad (11)$$

It is known that the frequency characteristic of the apparatus having the transmission characteristic H(s) is symmetric to the frequency characteristic of the apparatus having the transmission characteristic 1/H(s) with respect to the flat frequency characteristic.

Therefore, to obtain a symmetric frequency characteristic with respect to the flat frequency characteristic, it is desirable that the frequency characteristic adjusting apparatus having the transmission characteristic H(s) mentioned above is selectively changed into a frequency characteristic adjusting apparatus having the transmission characteristic H(s) expressed by the following equation:

$$H'(s) = \frac{1}{H(s)} \qquad (12)$$

$$= \frac{G_{11}[1 - F(s)] + G_{21}F(s)}{G_{12}[1 - F(s)] + G_{22}F(s)}$$

This is accomplished by the following manner. As apparent from equation (11), the shapes between the numerator and the denominator in the equation (11) are same. Accordingly, the transmission characteristic H'(s) is obtained by only exchanging the coefficient $G_{11}$ of the numerator with the coefficient $G_{12}$ of the denominator and exchanging the coefficient $G_{21}$ of the numerator with the coefficient $G_{22}$ of the denominator in the equation (11). Thus, in the frequency characteristic adjusting apparatus of the present invention, a symmetric frequency characteristic with respect to the flat frequency characteristic is obtained easily by exchanging the gains G11 and G21 of VCAs 16 and 19 with the gains G12 and G22 of VCAs 17 and 20.

FIG. 3 shows a circuit embodying VCAs 16 and 17 and the control signal generating circuit 18 shown in FIG. 2. VCAs 19 and 20 and control signal generating circuit 21 may have the same configuration as the circuit shown in FIG. 3. By employing the circuit shown in FIG. 3, the gains of VCAs 16 and 17 may be easily exchanged with each other.

In FIG. 3, an input signal Vin is applied to input terminals 25 and 26, respectively. Input terminals 25 and 26 are connected to the base electrodes of NPN transistors 27a and 27b, respectively. The emitter electrodes of transistors 27a and 27b are connected to a constant current source 29 through resistors 28a and 28b, respectively. The collector electrode of transistor 27a is connected to the emitter electrodes of a pair of transistors 30a and 30b, the emitter electrodes of which are connected in common. The collector electrodes of transistor 27b is connected to the emitter electrodes of a pair of transistors 31a and 31b, the emitter electrodes of which are connected in common. The base electrodes of transistors 30b and 31b are connected in common and connected to a control terminal 32. The base electrodes of transistors 30a and 31a are connected in common and connected to a control terminal 33. The collector electrodes of transistors 30a and 31a, respectively, are connected to collector electrodes of a pair of PNP transistors 35a and 35b which forms a current mirror circuit 34. The base electrode of transistor 35b is connected to the collector electrode thereof and further connected to the base electrode of transistor 35a. The emitter electrodes of transistors 35a and 35b are connected in common and connected to an electric power source 36.

The collector electrodes of transistors 30b and 31b, respectively, are connected to collector electrodes of a pair of PNP transistors 38a and 38b which forms a current mirror circuit 37. The base electrode of transistor 38a is connected to the collector electrode thereof and further connected to the base electrode of transistor 38b. The emitter electrodes of transistors 38a and 38b are connected in common and connected to electric power source 36. The collector electrodes of transistor 35a and 38b are connected to output terminals 39 and 40, respectively.

Gain control signal generating circuit 18 includes a potentiometer 41 connected between voltage sources +VA and −VA. The movable terminal of potentiometer 41 is connected to control terminal 32. Control terminal 33 is connected to ground.

In operation, input signals Vin are applied to transistors 27a and 27b through input terminals 25 and 26 respectively and converted into the current proportional to the input signal voltage Vin. As a result, the current expressed by $I_{in} = \alpha \overline{V}in$ (where $\alpha$ is the voltage-current conversion gain) flows at the collector electrodes of transistors 27a and 27b. The current $I_{in}$ flows into transistors 30a, 30b, 31a, and 31b and is amplified in response to the gain control signal Vc.

In general, the collector current Ic of the transistor is approximately expressed by the following equation:

$$I_c = I_s \exp\left(\frac{q}{kT} V_{BE}\right) \qquad (13)$$

where $I_s$ is the saturation current, VBE is the voltage between the base and emitter electrodes, a is the charge of electron, k is the Boltzmann's constant and T is the absolute temperature.

Accordingly, when the gain control signal Vc is supplied between control terminals 32 and 33, the output currents I₁ and I₂ expressed by the following equations are produced at output terminals respectively:

$$I_1 = \frac{1}{1 + \exp(Vc/Vt)} \alpha \, Vin \qquad (14)$$

$$I_2 = \frac{\exp(Vc/Vt)}{1 + \exp(Vc/Vt)} \alpha \, Vin \qquad (15)$$

where Vt=kT/q. As apparent from the equations (14) and (15), the output currents I₁ and I₂ may be varied by varying the gain control signal Vc.

From the equations (14) and (15), the gains G11 and G12 of VCAs 16 and 17 are expressed by the following equations:

$$G_{11} = \frac{1}{1 + \exp(Vc/Vt)} \alpha \qquad (16)$$

$$G_{12} = \frac{\exp(Vc/Vt)}{1 + \exp(Vc/Vt)} \alpha \qquad (17)$$

The equations (16) and (17) may also be expressed by the following equations:

$$G_{11} = \frac{1}{1 + \exp(Vc/Vt)} \cdot \frac{\exp(-Vc/Vt)}{\exp(-Vc/Vt)} \qquad (18)$$

$$= \frac{\exp(-Vc/Vt)}{1 + \exp(-Vc/Vt)}$$

$$G_{12} = \frac{\exp(Vc/Vt)}{1 + \exp(Vc/Vt)} \cdot \frac{\exp(-Vc/Vt)}{\exp(-Vc/Vt)} \qquad (19)$$

$$= \frac{1}{1 + \exp(-Vc/Vt)}$$

Accordingly, as apparent from the equations (16) to (19), the gains G₁₁ and G₁₂ have the relationship expressed by the following equations with the gain control signal Vc:

$$G_{11}(Vc) = G_{12}(-Vc) \qquad (20)$$
$$G_{12}(Vc) = G_{11}(-Vc) \qquad (21)$$

This means that the gain G₁₁ of VCA 16 is changed into the gain G₁₂ when the polarity of the gain control signal Vc is inverted, that is, −Vc is supplied to VCA 16. Also, the gain G₁₂ of VCA 17 is changed into the gain G₁₁ when the polarity of the gain control signal VC is inverted. The polarity of the gain control signal may be inverted easily by moving the movable terminal of potentiometer 41.

As mentioned above, the VCA circuit shown in FIG. 3 may exchange the gains G₁₁ and G₁₂ easily by only inverting the polarity of the gain control signal Vc. Therefore, the frequency characteristic adjusting apparatus according to the present invention may easily obtain the correctly symmetric frequency characteristic with respect to the flat frequency characteristic.

Figure 4:
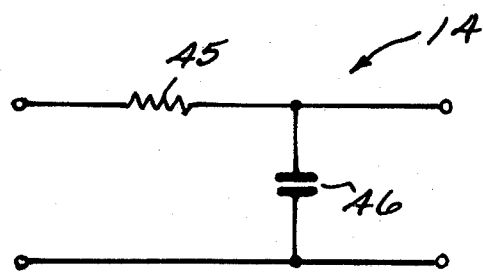
FIG. 4 shows an embodiment of the low-pass filter used in the frequency characteristic adjusting apparatus of FIG. 2.
Figure 5A:
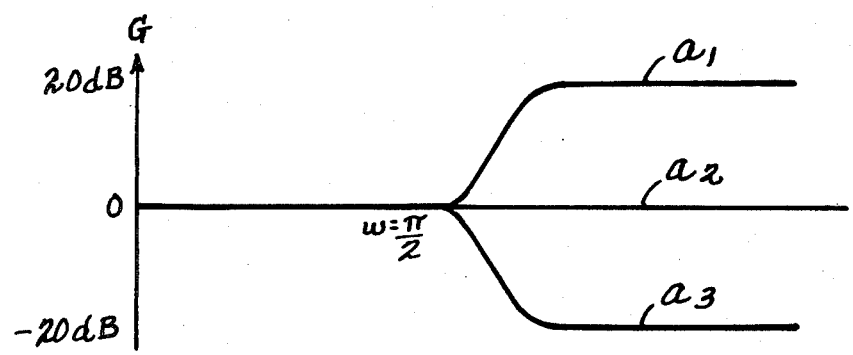
FIGS. 5A and 5B indicate the frequency characteristic of output signals of the frequency characteristic adjusting apparatus of FIG. 2.
Figure 5B:
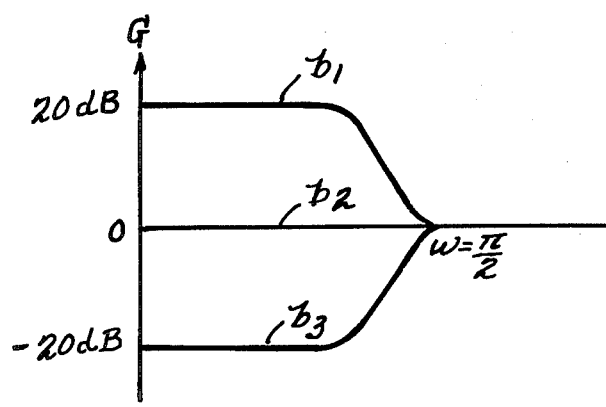

Filter circuit 14 employed in this invention is designed freely and easily because it is not necessary to vary its time constant so as to obtain the symmetric frequency characteristic with respect to the flat frequency characteristic. FIG. 4 shows a low-pass filter as an embodiment of filter circuit 14, which includes a resistor 45 and capacitor 46. The transfer function F(s) of this low-pass filter 14 is expressed by the following equation:

$$F(s) = 1/(1 + ts) \qquad (22)$$

where t is the time constant of filter 14. Accordingly, from the equation (11) the transmission characteristic H(s) of the frequency characteristic adjusting apparatus is expressed by the following equation:

$$H(s) = \frac{G_{22}\frac{1}{1+\pi s} + G_{12}\frac{\pi s}{1+\pi s}}{G_{21}\frac{1}{1+\pi s} + G_{11}\frac{\pi s}{1+\pi s}} \quad (23)$$

$$= \frac{G_{22} + G_{12}\pi s}{G_{21} + G_{11}\pi s}$$

The frequency characteristic ($H(jw)$) of the frequency characteristic adjusting apparatus is expressed by the following equation:

$$|H(jw)| = \left| \frac{G_{22} + G_{12}\pi jw}{G_{21} + G_{11}\pi jw} \right| \quad (24)$$

Accordingly, the frequency characteristic of the frequency characteristic adjusting apparatus is shown in FIGS. 4A and 4B. The characteristic curves shown in FIGS. 4A were obtained when the gains $G_{11}$ and $G_{12}$ of VCAs 16 and 17 were varied while the gains $G_{21}$ and $G_{22}$ of VCAs 19 and 20 were fixed at 0.5. Particularly, curve a1 was obtained when $G_{11}$ was 0.1 and $G_{12}$ was 1, curve a2 was obtained when $G_{11}$ and $G_{12}$ were 0.5, and curve a3 was obtained when $G_{11}$ was 1 and $G_{12}$ was 0.1. As mentioned above, the high frequency characteristic may be adjusted by increasing one of the gains $G_{11}$ and $G_{12}$ and at the same time decreasing the other of the gains $G_{11}$ and $G_{12}$ according to the equations (16) and (17). The symmetric frequency characteristic with respect to the flat frequency characteristic was obtained by reversing the relationship between the gains $G_{11}$ and $G_{12}$ as curves a1 and a3.

Curves shown in FIG. 4B were obtained when the gain $G_{21}$ and $G_{22}$ of VCAs 19 and 20 were varied while the gains $G_{11}$ and $G_{12}$ of VCAs 16 and 17 were fixed at 0.5. Particularly, curve b1, was obtained when $G_{21}$ was 0.1 and $G_{22}$ was 1, curve b2 was obtained when $G_{21}$ and $G_{22}$ were 0.5, and curve b3 was obtained when $G_{21}$ was 1 and $G_{22}$ was 0.1. Also the low frequency characteristic may be adjusted by increasing one of the gains $G_{21}$ and $G_{22}$ and at the same time decreasing the other of the gains $G_{21}$ and $G_{22}$. The symmetric frequency characteristic with respect to the flat frequency characteristic was obtained by reversing the relationship between the gains $G_{21}$ and $G_{22}$ as curves b1 and b3.

Figure 6A:
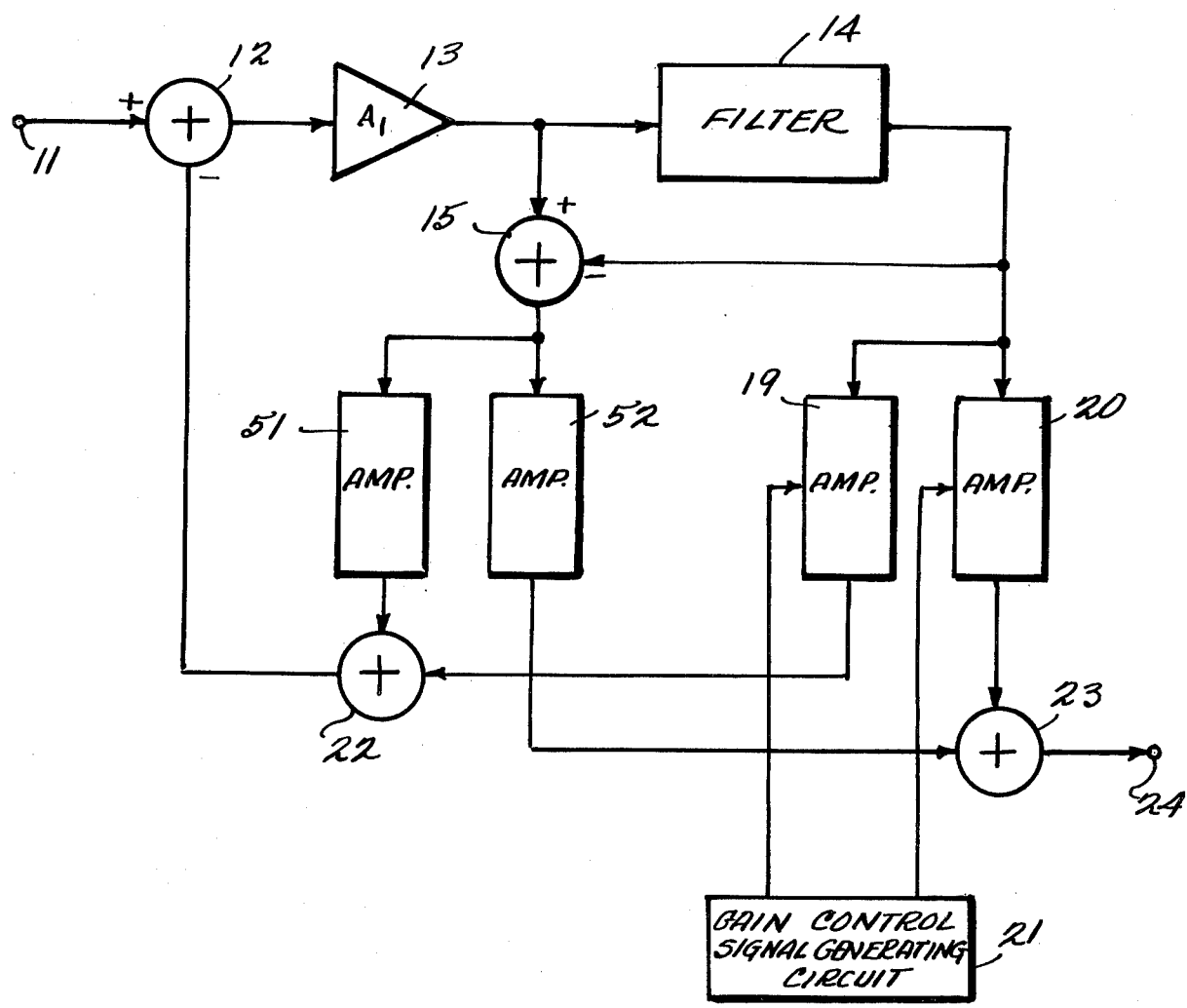
FIGS. 6A and 6B show respectively modifications of the frequency characteristic adjusting apparatus of FIG. 2.
Figure 6B:
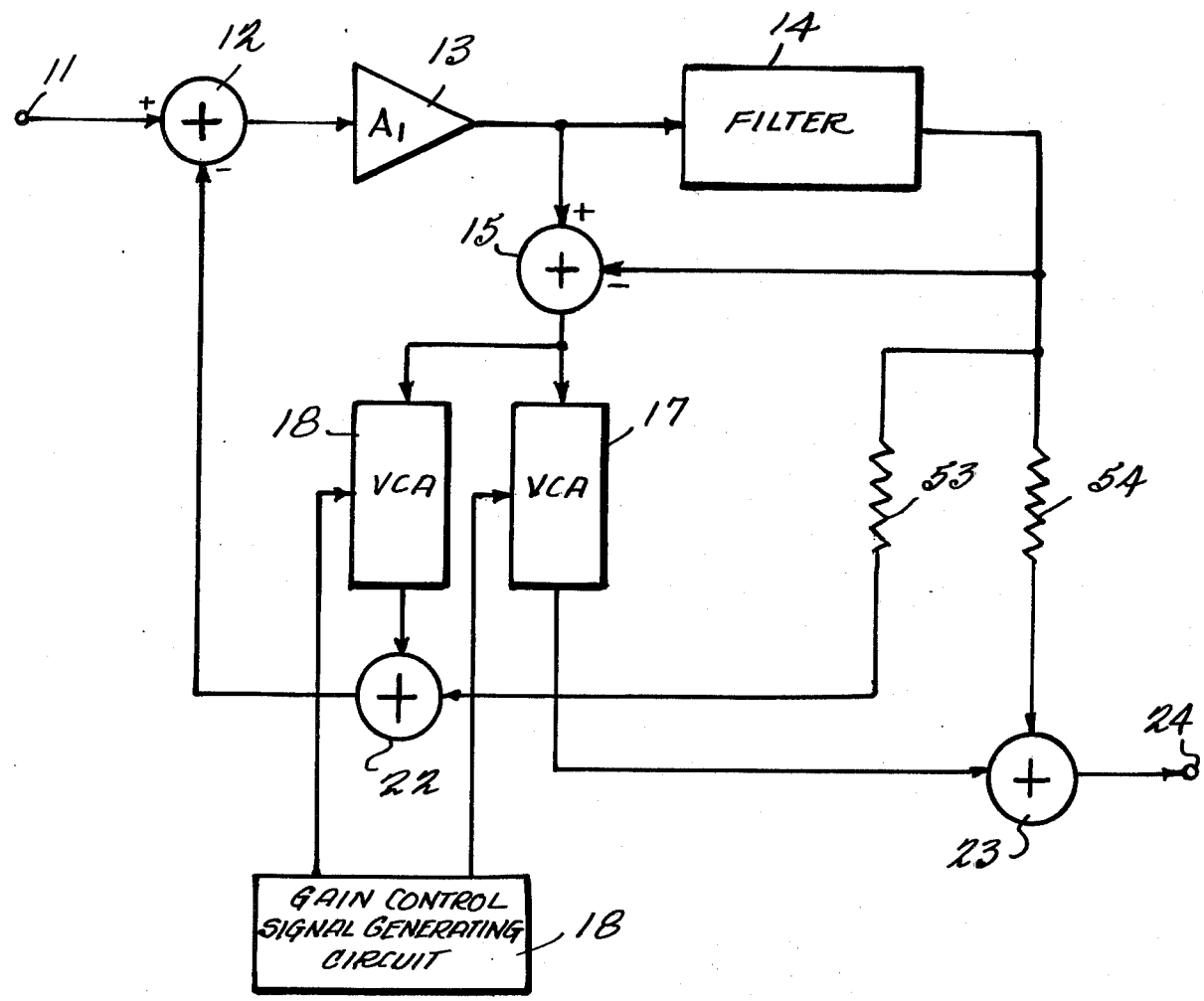

FIGS. 6A and 6B show modifications of the frequency characteristic adjusting apparatus shown in FIG. 2. In FIG. 2, at least either the pair of VCAs 16 and 17 or the pair of VCAs 19 and 20 may be replaced with other amplifiers having constant gains or resistors. Referring to FIG. 6A, amplfiiers 51 and 52 are not VCAs but amplifiers having constant gains. Referring to FIG. 6B, VCAs 19 and 20 shown in FIG. 2 are replaced with resistors 53 and 54.

Figure 7:
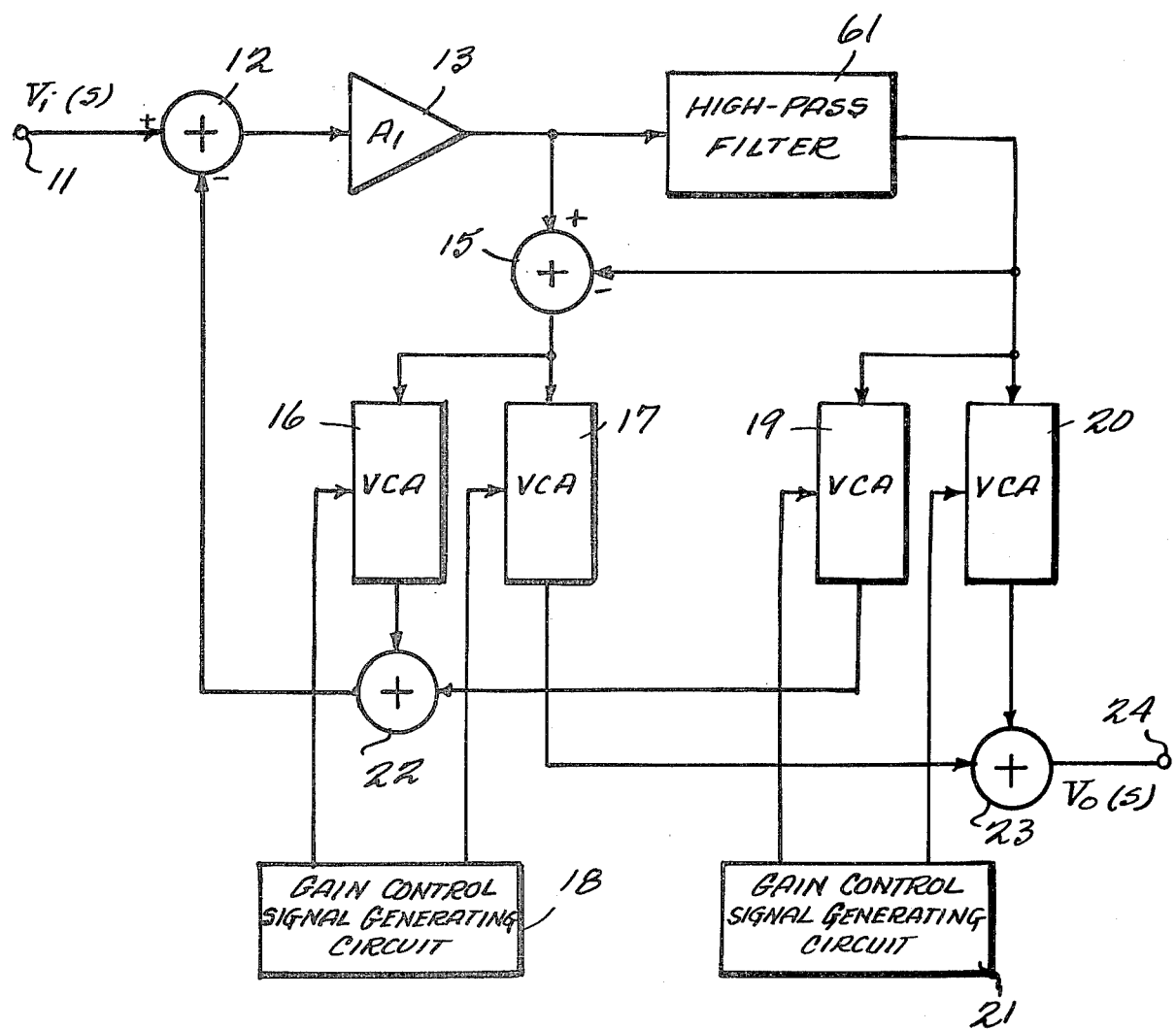
FIG. 7 is a schematic block diagram of the second embodiment, using a high-pass filter, of the frequency characteristic adjusting apparatus according to the present invention.

FIG. 7 shows the second embodiment of the frequency characteristic adjusting apparatus according to the present invention. In this embodiment, a high-pass filter 61 is used as the filter circuit. Accordingly, the high frequency signal component in the input signal Vi(s) is obtained from the output of high-pass filter 61 and the low frequency signal component in the input signal Vi(s) is obtained from output of subtraction circuit 15.

Figure 8:
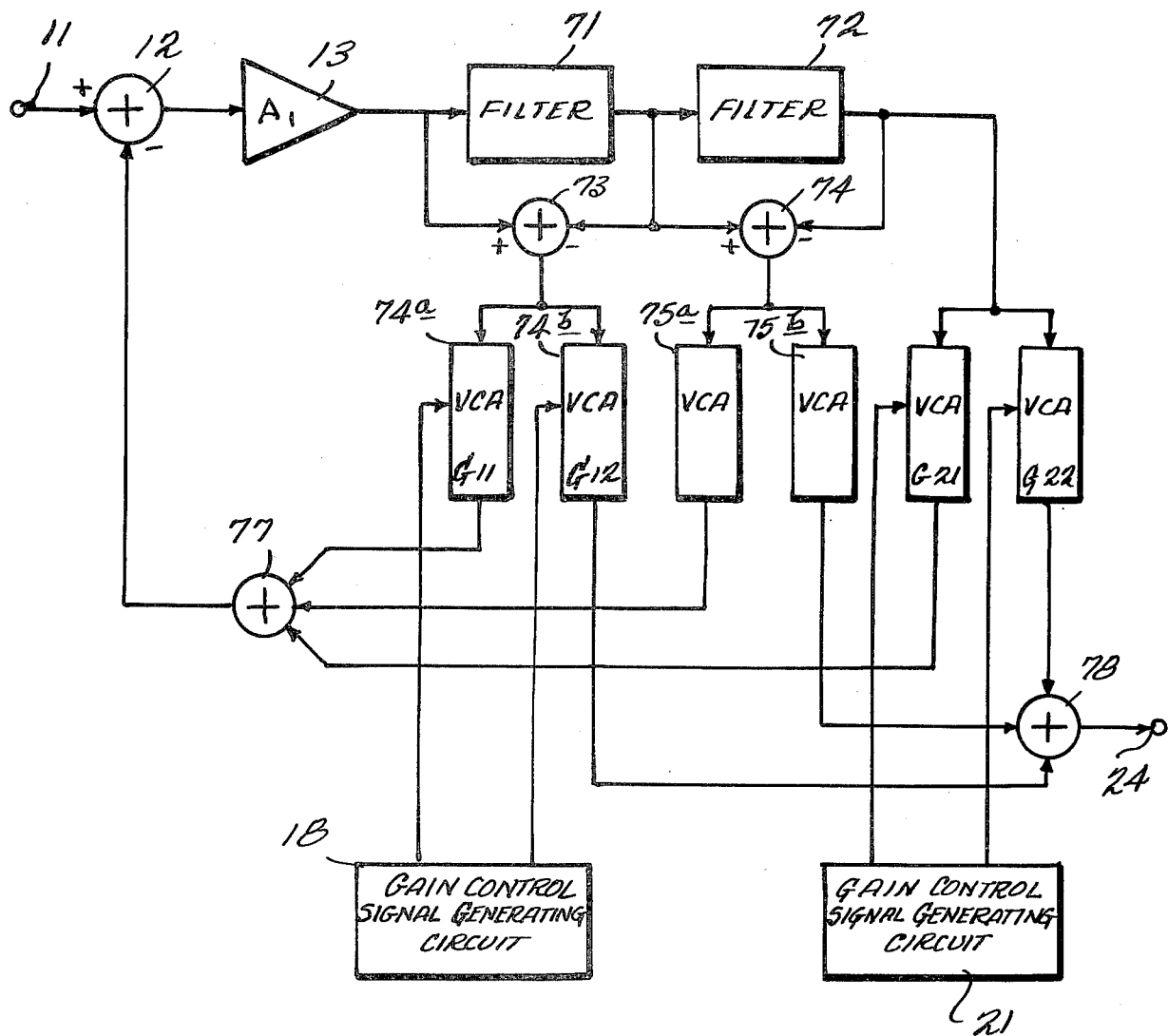
FIG. 8 is a schematic block diagram of the third embodiment according to the present invention.

FIG. 8 shows the third embodiment of the frequency characteristic adjusting apparatus. This embodiment employs a pair of filter circuits 71 and 72 to separate the input signal into three frequency bands. Filter circuits 71 and 72 are low-pass filters, the cut-off frequency of which are fc1 and fc2 (fc1 being greater than fc2) respectively. Filter circuits 71 and 72 may be high-pass filters, the cut off frequency of which are fc3 and fc4 (fc3 being less than fc4) respectively.

In the apparatus, a subtraction circuit 73 subtracts the output signal from low-pass filter 71 from the input signal thereinto. The output signal of subtraction circuit 73 is delivered to VCAs 74a and 74b. A subtraction circuit 74 subtracts the output signal from low-pass filter 72 from the input signal thereinto. The output signal of subtraction circuit 74 is delivered to amplifiers 75a and 75b with constant gains, respectively. The output signal of filter circuit 72 is delivered to VCAs 76a and 76b. The output signals of VCA 74a, VCA 76a and amplfier 75a are delivered to an adder circuit 77 to add together. The output signal of adder circuit 77 is delivered to subtraction circuit 12. The output signals of VCA 74b, VCA 76b and amplifier 75b are delivered to an adder circuit 78 to add together. The output signal of adder circuit 78 is delivered to output terminal 24. The gains of VCAs 76a and 74b are controlled by gain control signal generator 18. The gains of VCAs 76a and 76b are controlled by gain control signal generator 21.

Figure 9:
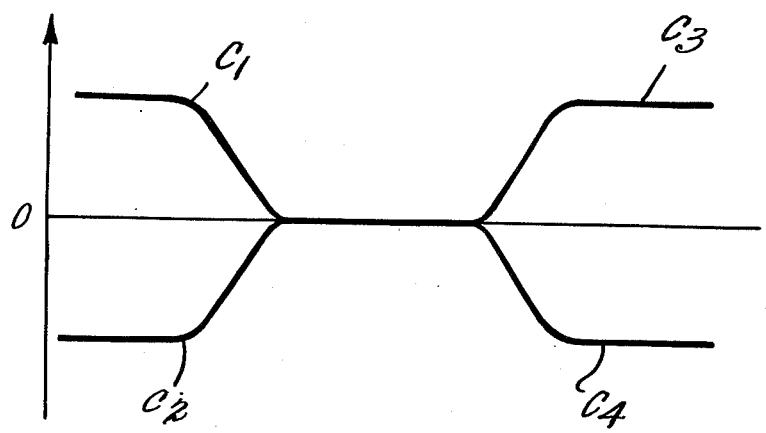
FIG. 9 indicates the frequency characteristic of the frequency characteristic adjusting apparatus of FIG. 2.

The frequency characteristic of the high frequency signal band is adjusted by controlling the gains $G_{11}$ and $G_{12}$ of VCAs 74a and 74b, and the frequency characteristic of the low frequency signal band is adjusted by controlling the gains $G_{11}$ and $G_{22}$ of VCAs 76a and 76b as shown in FIG. 9. In FIG. 9, the curve C1 is obtained when the gain $G_{22}$ of VCA 76b increases and the gain $G_{21}$ of VCA 76a decreases, and the curve C2 is obtained when the gain $G_{21}$ of VCA 76a increases and the gain $G_{22}$ of VCA 76b decreases. The curve C3 is obtained when the gain $G_{12}$ of VCA 74b increases and the gain $G_{11}$ of VCA 74a decreases, and curve C4 is obtained when the gain $G_{11}$ of VCA 74a increases and the gain $G_{12}$ of FCA 74b decreases.

Figure 10:
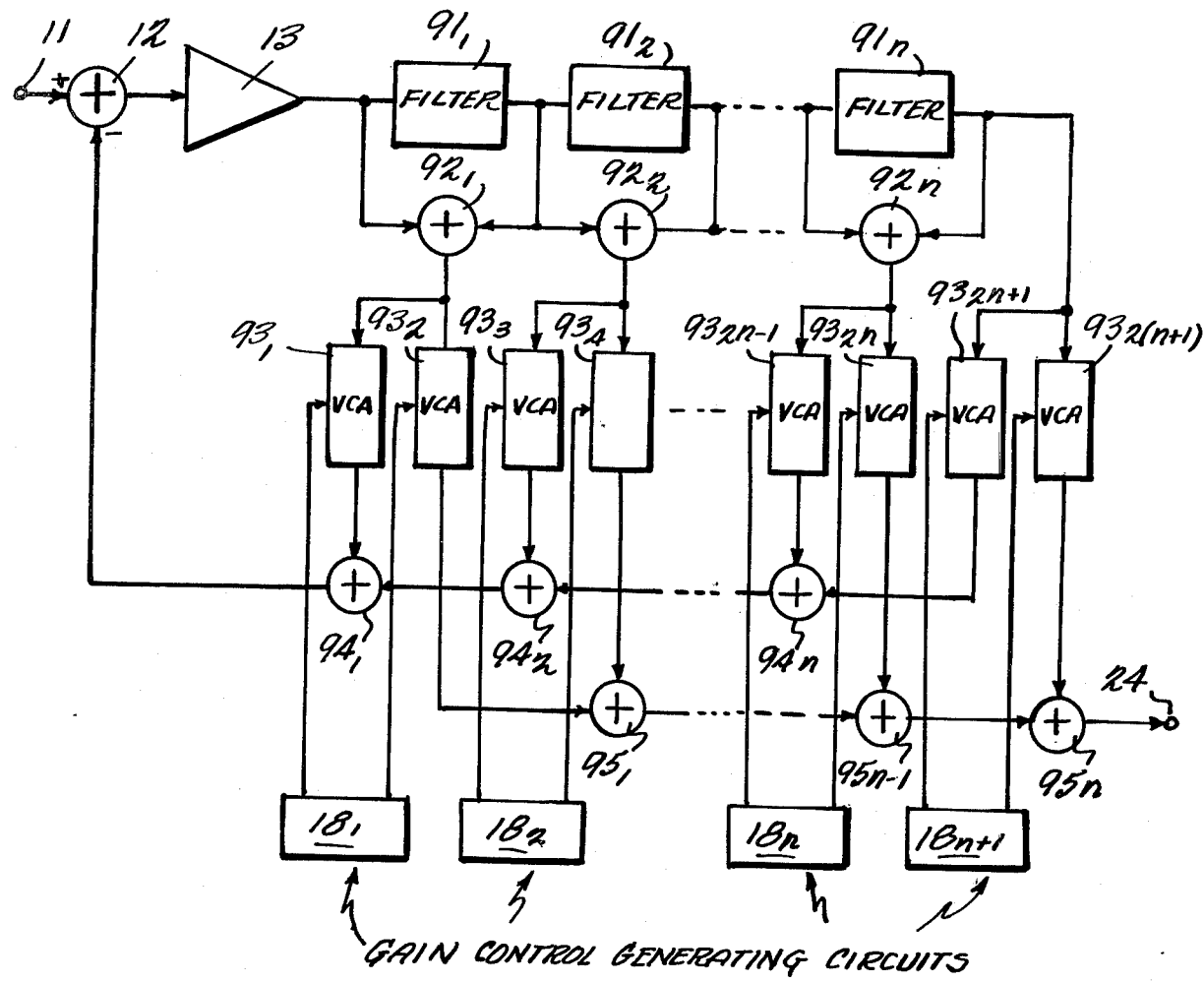
FIG. 10 is a schematic block diagram of the fourth embodiment according to the present invention.

FIG. 10 shows the fourth embodiment of the frequency characteristic adjusting apparatus. This embodiment employs more than two filter circuits 911, 912, . . ., 91n connected in series. Subtraction circuits 921, 922, . . ., 92n obtain the difference signals between the input and output signals of subtraction circuits 911, 912, . . ., 91n. A plurality of VCAs 931, 932, . . . , 932(n+1) amplify the output signals from subtraction circuits 921, 922, . . ., 92n in response to the gain control signals from gain control signal generating circuits 181, 182, . . . , 18n. Adder circuits 941, 942, . . . , 94n and 951, 952, . . ., 95n add the output signals from VCAs 931, 932, . . . , 932(n+1). According to this embodiment, the frequency characteristics of a plurality of frequency bands may be adjusted independently.

While the invention has been described in connection with what is presently considered to be the most practical and preferred embodiments, it is to be understood that the invention is not to be limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

What is claimed is:

1. A frequency characteristic adjusting apparatus comprising:
   an amplifier for amplifying an input signal having a predetermined amplitude to produce an output signal;
   frequency band dividing means, coupled to said amplifier, for dividing the output signal from said amplifier into first and second frequency bands;
   first and second gain control means for controlling the gain of said first frequency band signal from said frequency band dividing means, respectively;
   third and fourth gain control means for controlling the gain of said second frequency band signal from said frequency band dividing means, respectively;
   first adder means for adding together the output signals from said first and third gain control means and then negatively feeding the added signal back to the input of said amplifier;
   second adder means for adding together the output signals from said second and fourth gain control means; and
   means for generating and supplying a gain control signal to either said first and second gain control means or said third and fourth gain control means, said pair of gain control means receiving the gain control signal from said gain control signal generating means being controlled such that when the gain of one of said gain control means increases, the gain of the other decreases as controlled by the signal from said gain control signal generating means.

2. An apparatus according to claim 1, wherein said frequency band dividing means comprises:
   a filter circuit for filtering the signal from said amplifier; and
   a subtraction circuit for subtracting the output signal of said filter circuit from the input signal thereof.

3. An apparatus according to claim 2, wherein said filter circuit is a low-pass filter.

4. An apparatus according to claim 2, wherein said filter circuit is a high-pass filter.

5. An apparatus according to claim 1, wherein said first and second gain control means are voltage controlled amplifiers connected to said gain control signal generating means, and said third and fourth gain control means are amplifiers having constant gains.

6. An apparatus according to claim 1, wherein said first and second gain control means are voltage controlled amplifiers connected to said gain control signal generating means, and said third and fourth gain control means are resistors.

7. An apparatus according to claim 5 or 6, wherein said voltage controlled amplifier of said first and second gain control means comprise:
   first and second transistors, the base electrodes of which being connected to input terminals respectively, and the emitter electrodes of which are connected to a current source;
   third and fourth transistors, the emitter electrodes of which are connected in common and connected to the collector electrode of said first transistor, the base electrodes of which are connected to said gain control signal generating circuit, respectively;
   fifth and sixth transistors, the emitter electrodes of which are connected in common and connected to the collector electrode of said second transistor, the base electrodes of which are connected to said gain control signal generating circuit, respectively;
   a first current mirror circuit connected between the collector electrodes of said third and fifth transistors;
   a second current mirror circuit connected between the collector electrodes of said fourth and sixth transistors.

8. An apparatus according to claim 1, wherein said gain control signal generating means generates the voltage signal from negative voltage to positive voltage.

9. A frequency characteristic adjusting apparatus comprising:
   means for amplifying an input signal having a predetermined amplitude to produce an output signal;
   frequency band dividing means, coupled to said amplifying means, for dividing the output signal from said amplifying means into at least three frequency bands;
   gain control means for each of said divided frequency bands, each gain control means including first and second voltage controlled amplifiers, for controlling the gain of a signal in that frequency band from said frequency band dividing means;
   first adder means for adding together output signals from all said first voltage controlled amplifiers of said gain control means and then negatively feeding the added signal back to the input of said amplifying means;
   second adder means for adding together output signals from all said second voltage controlled amplifiers of said gain control means; and
   gain control signal generating means for each of said gain control means for generating and supplying gain control signals to said first and second voltage controlled amplifiers, said first and second voltage controlled amplifiers being controlled such that when the gain of one of said first and second voltage controlled amplifiers increases, the gain of the other decreases as controlled by the signal from said control signal generating means.

* * * * *